(12) United States Patent
Tilton et al.

(10) Patent No.: US 7,779,896 B2
(45) Date of Patent: Aug. 24, 2010

(54) PASSIVE FLUID RECOVERY SYSTEM (75) Inventors: Charles L Tilton, Colton, WA (US);
Donald Tilton, Colton, WA (US);
Thomas D Weir, Pullman, WA (US);
Randall T. Palmer, Liberty Lake, WA (US)

(73) Assignee: Parker-Hannifin Corporation, Cleveland, OH (US)

( * ) Notice: Subject to any disclaimer, the term of this patent is extended or adjusted under 35 U.S.C. 154(b) by 455 days.

(21) Appl. No.: 11/944,244

(22) Filed: Nov. 21, 2007

(65) Prior Publication Data
US 2008/0066892 A1 Mar. 20, 2008

Related U.S. Application Data (63) Continuation of application No. 11/275,307, filed on Dec. 22, 2005.

(51) Int. Cl.
*F28D 15/02* (2006.01)
(52) U.S. Cl. .................................. 165/104.31; 165/80.4
(58) Field of Classification Search ................ 165/80.4, 165/80.5, 104.25, 104.28, 104.31; 361/699, 361/700
See application file for complete search history.

(56) References Cited

U.S. PATENT DOCUMENTS

| | | | |
|---|---|---|---|
| 3,073,575 | A | 1/1963 | Schulenberg |
| 3,710,854 | A | 1/1973 | Staub |
| 4,300,481 | A | 11/1981 | Fisk |
| 4,352,392 | A | 10/1982 | Eastman |
| 5,220,804 | A | 6/1993 | Tilton et al. |
| 5,333,677 | A | 8/1994 | Molivadas |
| 5,522,452 | A | 6/1996 | Mizuno et al. |
| 6,104,610 | A | 8/2000 | Tilton et al. |
| 6,105,373 | A | 8/2000 | Watanabe et al. |
| 6,139,361 | A | 10/2000 | Przilas et al. |
| 6,437,983 | B1 | 8/2002 | Machiroutu et al. |
| 6,580,610 | B2 | 6/2003 | Morris et al. |
| 6,646,879 | B2 | 11/2003 | Pautsch |
| 6,976,528 | B1 | 12/2005 | Tilton et al. |
| 2001/0002541 | A1 | 6/2001 | Patel et al. |
| 2002/0113141 | A1 | 8/2002 | Malone et al. |
| 2005/0168948 | A1 | 8/2005 | Cader et al. |

*Primary Examiner*—Teresa J Walberg
(74) *Attorney, Agent, or Firm*—Lee & Hayes, PLLC (57) ABSTRACT A fluid recovery system is adapted for use with a cooling system, such as for use in electronic applications. In one example, an enclosure is configured to contain fluid in both gas and liquid states, wherein the fluid is adapted for use in spray cooling electronic components. A plurality of pick-up ports is defined within the enclosure. In one implementation of the cooling system, an orifice size used in each of the pick-up ports results in withdrawal of fluid from submerged and non-submerged pick-up ports.

25 Claims, 6 Drawing Sheets

PASSIVE FLUID RECOVERY SYSTEM

RELATED APPLICATIONS

This patent application claims priority to, and is related to, U.S. patent application Ser. No. 11/275,307, titled "Passive Fluid Recovery System", filed on Dec. 22, 2005, commonly assigned herewith, and hereby incorporated by reference.

BACKGROUND

Many electronic devices are air-cooled, such as by a passive or active cooling system. Passive cooling systems can be as simple as inclusion of ventilation slots in an enclosure containing the device. Active cooling systems can include a fan, which typically increases the rate of heat removal.

In more advanced cooling systems, a dielectric fluid can be used to provide even greater heat removal. Fluid is continuously cycled between a sprayer, locations wherein the fluid is in contact with components, and a pump. In a stationary system, a sump may collect liquid dielectric fluid from the bottom of an enclosure surrounding the system. However, in a mobile system, both the rate of acceleration and the direction of acceleration of the enclosure can vary with time. As a result, dielectric fluid does not consistently move to an expected location within the enclosure. Accordingly, recovery of dielectric fluid from within a mobile spray-cooled system presents challenges that have not previously been fully resolved.

SUMMARY

A fluid recovery system is adapted for use with a cooling system, such as for use in electronic applications. In one example, an enclosure is configured to contain fluid in both gas and liquid states, wherein the fluid is adapted for use in spray cooling electronic components. A plurality of pick-up ports is defined within the enclosure. In one implementation of the cooling system, an orifice size used in each of the pick-up ports results in withdrawal of fluid from ports that are submerged in liquid coolant and ports not submerged in liquid coolant.

This Summary is provided to introduce selected topics, which are further described below in the Detailed Description. Accordingly, the Summary is not intended to identify key or essential features of the claimed subject matter. In particular, the Summary is not to be used as an aid in determining the scope of the claimed subject matter.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical items.

DETAILED DESCRIPTION

Overview of the Problem

Spray cooling is a highly efficient method of cooling electronics. In one example of spray cooling, a dielectric liquid is sprayed onto the components within a fluid-tight enclosure. Some of the liquid lands on the electronic components and removes waste heat. A portion of the heat is removed from the devices through heating of the liquid. Additional heat is removed by a phase change of the sprayed liquid, resulting in a vapor. Both the liquid and the vapor then pass through a heat exchanger where the vapor is condensed and the liquid is sub-cooled below the liquid saturation curve.

In some spray module systems, momentum of the vapor can be utilized to carry both the vapor and the liquid to a remote heat exchanger. This is possible in spray modules of small volume, wherein the conduit to the heat exchanger is appropriately designed. Where the flow is primarily momentum driven, the system will operate in any orientation. In the heat exchanger, the vapor is condensed and the liquid is sub-cooled before entering the pump.

In other spray cooling systems, a small volume of liquid is contained within an enclosure having a relatively large volume. This results in relatively small fluid velocities and the separation of fluid into vapor and liquid phases within the enclosure. Condensation on the enclosure walls further reduces the vapor quality (i.e. the percentage of the fluid in the vapor phase). Low vapor quality and low vapor velocities tend to counter fluid movement toward the heat exchanger and/or the pump inlet. As a result, liquid moves freely within the enclosure, and is driven almost exclusively by inertial forces. In stationary systems, a sump may be incorporated in the bottom of the enclosure to collect the liquid. In mobile systems, a variable acceleration vector can drive the fluid in any direction. This presents the problem of removing a small amount of liquid in a relatively large volume defined by the enclosure.

Systems that allow operation in any orientation and under a variable acceleration vector can be referred to as attitude independent (AI). Such systems operate independently of the attitude of the vehicle within which the system is mounted. In a mobile system, acceleration vectors tend to pool fluid in locations within the enclosure that include one or more corners. Liquid can be removed from such a system using mechanical valves that are actuated in response to inertia, or using solenoid valves activated by capacitive fluid sensors. In both systems having either type of valve, a fluid pick-up port may be located at various locations within the main enclosure but are typically located near each corner of the enclosure.

However, by incorporating valves into each corner of a system, a large number of potential failure points are created. Moreover, the cost and power draw of the active AI system are also of concern. Accordingly, design of a passive fluid recovery system would obviate some of these concerns.

Example System

Figure 1:
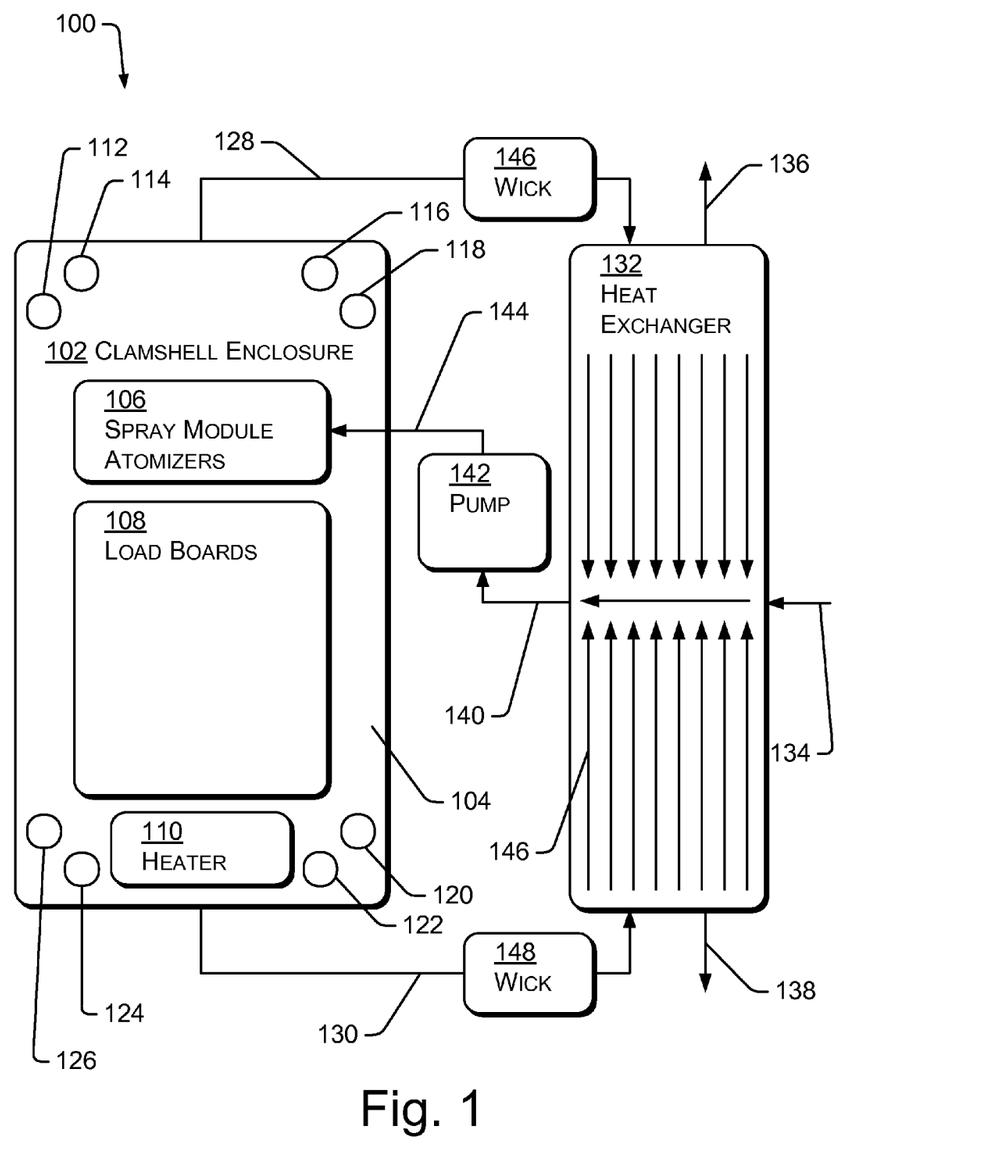
FIG. 1 is a block diagram illustrating an exemplary passive fluid recovery system.

FIG. 1 is a block diagram illustrating an exemplary passive fluid recovery system 100. A clamshell enclosure 102 includes similar front 104 and back (not shown) faces separated by a distance that is less than either dimension of the front and/or back faces. Within the clamshell enclosure 102 a spray module 106 is configured to spray coolant at one or more 'load boards' 108, which can be configured as electronic circuit cards including one or more heat-producing electronic devices. A heater 110 is sized to produce heat required to increase vapor quality at start-up, prior to turning on the load board 108. That is, the heater 110 will increase the percentage of the fluid that is in the vapor (i.e. gas) phase. In one implementation, the system 100 is configured to generate a vapor quality resulting in a pressure of 0.23 psi (pounds per square inch) for operation. In normal running mode, heat generated by the electronics creates the needed vapor. During startup, before the electronics are powered, another means of generating vapor may be needed. Accordingly, heaters 110 that are initially submerged in a liquid pool in the enclosure 102 can be used for this purpose.

Fluid, in both liquid and gas phases, is removed from the enclosure 102 through pick-up ports 112-126, and is transferred via tubing or pipes 128, 130 to a heat exchanger 132. The heat exchanger 132 uses in-coming air 134 to remove heat from fluid within the heat exchanger. Heated air is exhausted at 136, 138. Removal of heat while in the heat exchanger 132 fully transforms vapor components of the fluid removed from the enclosure 102 into liquid, and cools the liquid. The fluid is then removed from the heat exchanger 132 via pipe 140 and passed into the pump 142, which increases the pressure of fluid leaving the pump at 144, for introduction into the spray module 106. Note that in a compound heat exchanger, each of a plurality of channels 146 may be associated with a single pick-up port orifice. Use of such a compound heat exchanger tends to isolate either liquid or vapor in each channel. This tends to prevent vapor from passing through the heat exchanger without condensing into liquid.

When electronic components (e.g. components on load board 108) are spray cooled (such as by spray module 106), only a portion of the sprayed liquid is vaporized. The percentage of the fluid vaporized can range from zero percent in a relatively large enclosure having relatively low power consumption, to approximately eighty percent or more in relatively small enclosures having relatively high power consumption. To maintain the system in an operative state, fluid comprising both the liquid and vapor states is generally removed from the enclosure at the same rate that fluid is introduced into the system via the spray module atomizers 106—a rate that is governed in part by the power consumption of the system. Because fluid, in both the liquid and vapor states, is distributed within the enclosure 102 in part due to an acceleration vector that changes in both direction and magnitude with time, a plurality of pick-up ports 112-126 are distributed within the enclosure, thereby providing a number of locations from which fluid can be removed.

The distribution of the pick-up ports 112-126, and their diameters, control aspects of withdrawing a satisfactory quantity of both liquid and vapor, simultaneously, for cooling by the heat exchanger 132 and return to the enclosure 102 via the spray module 106. Because of the manner in which liquid and vapor fluid are distributed within the enclosure 102, more ports are exposed to vapor than are exposed to liquid. An additional impediment to fluid removal is that those ports that are exposed to liquid may be at a point lower than the pump inlet, and therefore have a hydrostatic head pressure component to overcome.

Accordingly, a preferred distribution of pick-up ports 112-126 will provide a passive attitude independent (AI) solution by addressing at least two important aspects. First, the distribution of pick-up ports within the enclosure should minimize variance in a number of ports submerged in liquid. That is, changes in the attitude of the enclosure should result in minimal change in the number of liquid-submerged pick-up ports. Secondly, the diameter used for the pick-up ports should result in sufficient fluid entering both those ports submerged in liquid and those in vapor, so that the total quantity of fluid removed is roughly equal to that needed to supply the spray module and remove heat generated by the load. Additionally, since a majority of the pick-up ports will not be exposed to liquid, the heat exchanger 132 must be able to condense vapor fully, thereby preventing vapor from reaching the pump.

An implementation of the system 100 optionally includes one or more wicks 146, 148, typically located in a fluid path between one or more pick-up ports 112-126 and the spray module 106. The wicks are configured to remove and hold foreign fluid, such as water, air, etc. A wick can be configured in a number of ways; e.g., a fibrous material trapped in a widened area of the pipe (e.g. 128, 130) can be used to catch and retain foreign material. Thus, a wetted wicking material transports liquid, while preventing air or other non-condensable gasses from passing due to surface tension of the liquid present in the wick. Accordingly, a wick transports fluid, while essentially removing undesirable gasses from the system.

In some cases, it may be desirable to transport some or all of the captured noncondensable gasses back into the system at another point in the system, e.g. at the pump outlet. In other cases, it may be desirable to vent these gasses from the system altogether. In either case, an active or passive means for noncondensable gas transport can be advantageous.

Removing Fluid from the System

Liquid in the enclosure can be accessed in any orientation if there is at least one pickup near each corner. If one pickup is placed at the vertex of each corner, the number of pickups covered by liquid can vary greatly with orientation. For example, if the acceleration vector is normal to the bottom face of the enclosure, four of the eight pickups will be covered with liquid. Conversely, if the acceleration vector is parallel to a line through the enclosure centroid and a corner, only one of the eight pickups will be covered with liquid. The variation in operation from 12.5% coverage of pick-up ports by liquid (as opposed to vapor) to 50% coverage would greatly complicate the fluid control scheme. In contrast to this example, the examples of FIGS. 2 and 3 provide a distribution of pick-up ports wherein the percentage of ports covered by liquid is less variable when an attitude of the enclosure is altered with respect to gravity and/or acceleration.

Figure 2:
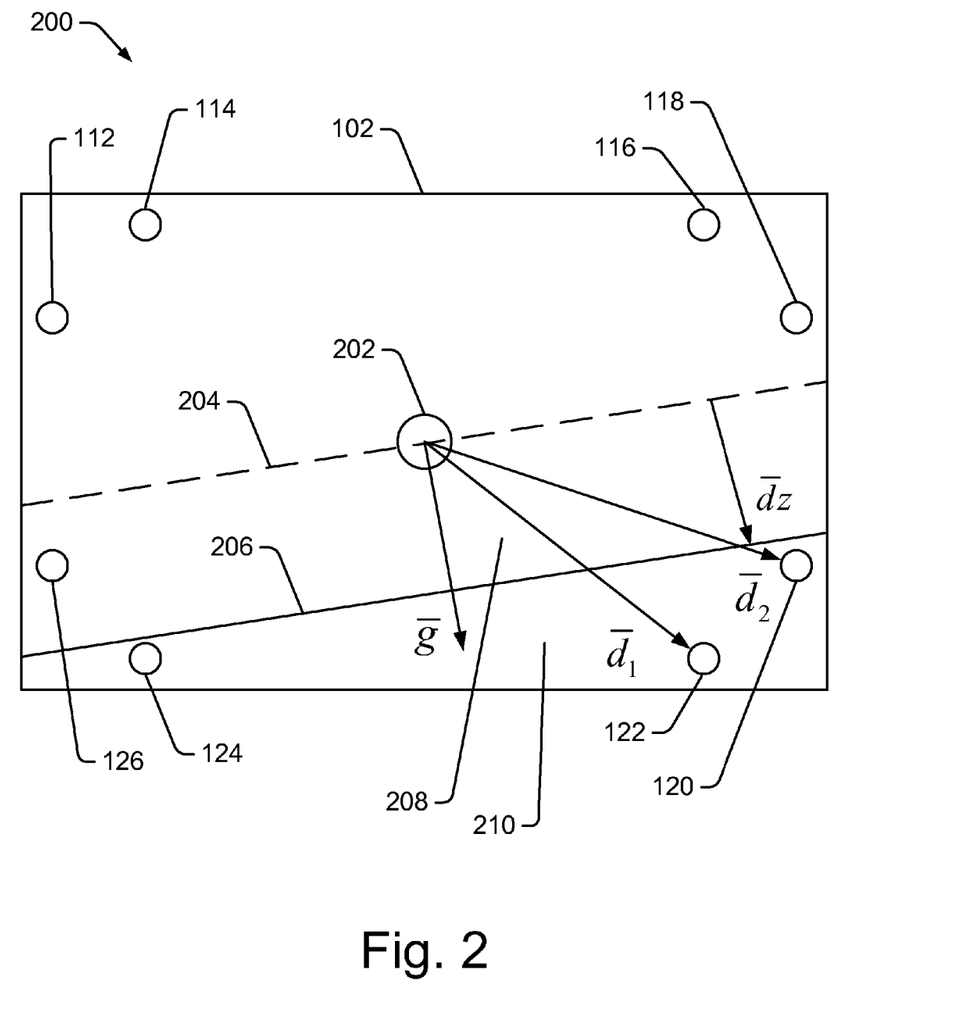
FIG. 2 illustrates aspects of pick-up port placement in an exemplary fluid-cooled system having dimensions consistent with clamshell construction.
Figure 3:
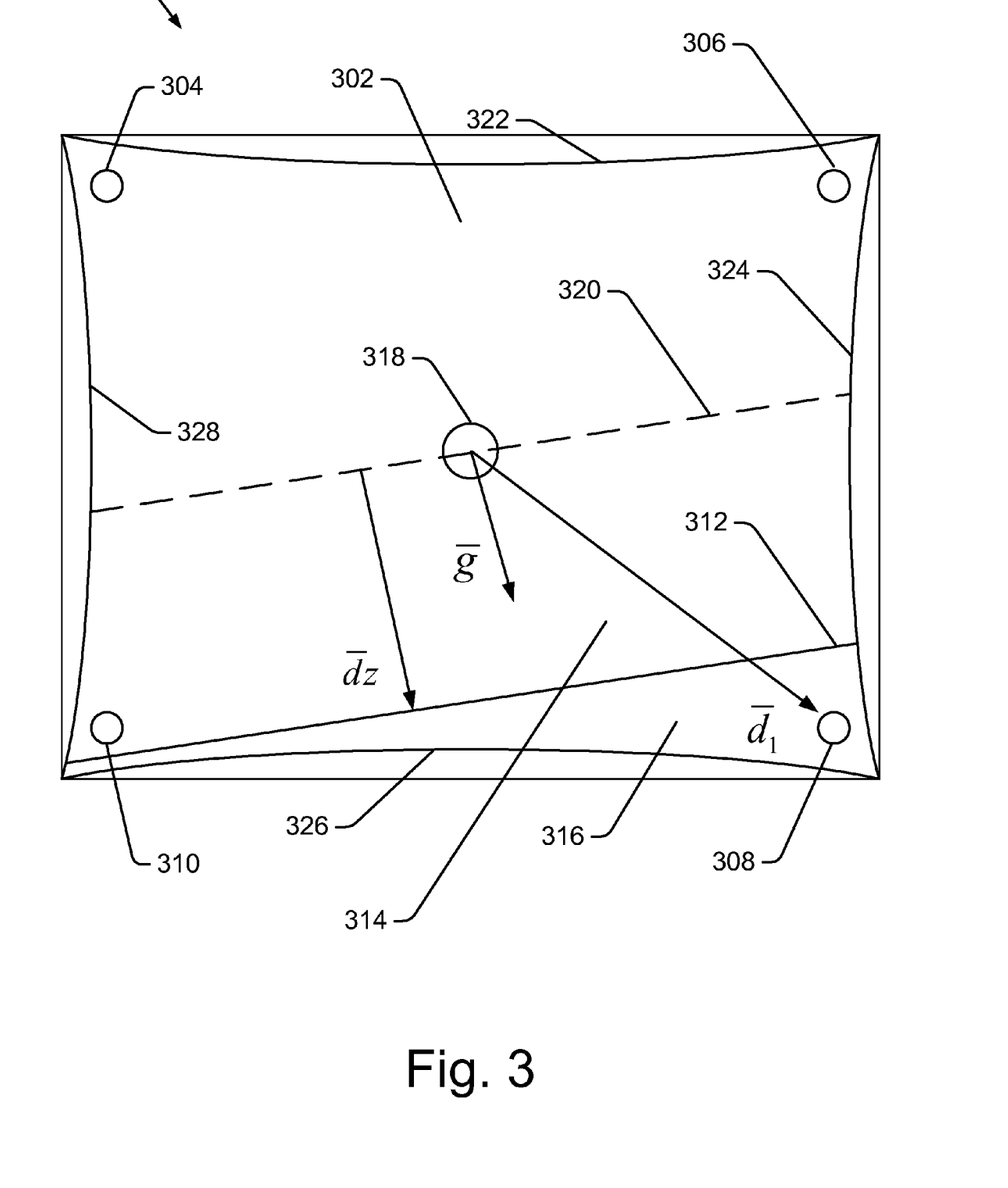
FIG. 3 illustrates aspects of pick-up port placement in an exemplary fluid-cooled system having an enclosure dimensions consistent with six similarly sized sides.

FIGS. 2 and 3 show two implementations of pick-up port distribution within an enclosure that show a percentage of the pick-up ports covered with liquid is relatively constant, despite changes in orientations with respect to gravity and/or an additional acceleration vector, perhaps having changing direction and/or magnitude.

Referring to FIG. 2, aspects of a passive fluid recovery system 200 are shown. The system 200 is configured to include a clamshell type enclosure 102, wherein two pick-up ports are defined in each corner of both the front and back sides of the enclosure, resulting in 16 total pick-up ports 112-126. No pick-up ports are defined in the other four sides of the enclosure. In the enclosure 102 of FIG. 2, the variation in liquid coverage ranges from 19% to 50% of the pick-up ports; conversely 50% to 81% of the pick-up ports are covered by vapor (gas). However, if the enclosure is constructed so that it is very unlikely that the acceleration vector will be normal to the two large sides of the enclosure, the variation in liquid coverage may be confined to between 19% and 25%. The enclosure can be constructed in a manner that prevents acceleration forces from being normal to the large sides by altering the internal geometry of the large sides (e.g. curving them, slanting them, ramping them or introducing a slope, etc.), thereby making the combination of these vectors very unlikely to combine to create an acceleration vector normal to the larger faces.

Referring to FIG. 3, aspects of a passive fluid recovery system 300 are shown. The system 300 is configured to include an enclosure having six similarly-sized sides 302, one of which is shown in plan view and four are seen in cross-section. Each side 302 of the enclosure 300 includes one pick-up port located near each corner. In the example, side 302 shown, pick-up ports 304-310 are representative of the 24 pick-up ports included in the six sides of the system 300.

Because of the configuration of the system 300, the variation in liquid coverage ranges from 12.5% to 16.7% of the pick-up ports. This can be understood by realizing that if the fluid pooled entirely in one corner, three pick-up ports, out of 24 total, would be entirely covered, resulting in 12.5% of the pick-up ports covered by liquid. However, if the liquid is thinly distributed to cover an inside surface of one side of the enclosure, then 4 of the 24 pick-up ports will be covered with fluid, resulting in 16.7% of the pick-up ports being covered by liquid.

FIG. 3 shows an example of an enclosure constructed to essentially prevent an acceleration vector normal to a side of the enclosure. Interior surfaces of enclosure sidewalls 322-328 are curved to direct liquid to accumulate in the corners formed by intersection of three sidewalls. Exterior surfaces can be either curved or planar. Because the liquid is so directed, the variation in liquid coverage of pick-up ports may be confined within a narrow range. For example, in the system 300 of FIG. 3, it is typical that between 19% and 25% of the pick-up ports are covered by liquid at any time. The curved sides used to construct the enclosure prevent a combination of gravity and acceleration forces from being normal to the sides. While curved concave interior surfaces 322-328 are shown, convex sides, round sides, slanting side and sides or other configurations may also be used to reduce variation in the percentage of pick-up ports covered by liquid. Also, while the interior surfaces 322-328 are depicted having a curvature over the entire wall, a wall having both orthogonal and curved portions may be more easily assembled. Thus, an implementation having an enclosure defined by at least one non-planar wall (e.g. a curved wall) or one non-orthogonal wall (e.g. a wall slanted with respect to other walls) can reduce the variance in the number of pick-up ports covered by liquid as a function of an acceleration and/or gravity vector.

Mass Flow Rate Calculation

Figure 4:
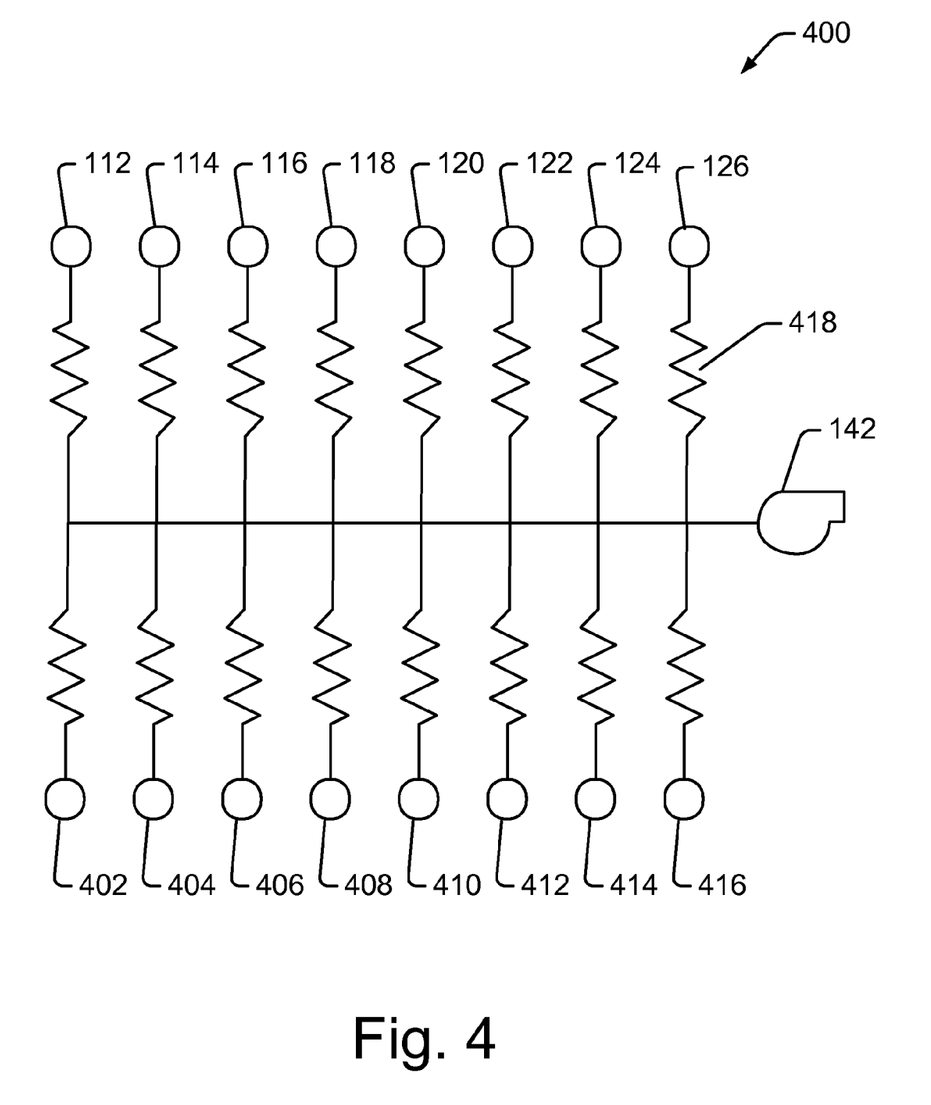
FIG. 4 shows a plurality of pick-up ports and a pump, modeled after a resister network as an aid in discussion.

FIG. 4 shows a plurality of pick-up ports 112-126, 402-416 and a pump 142, modeled as a resister network 400, for purposes of discussion of the fluid metering problem. The fluid metering problem involves a number of aspects, although two are of primary importance. First, the percentage of pick-up ports that are covered in liquid is important, since fluctuation in the percentage tends to result in fluctuation in the amount of fluid removed from the enclosure. Second, the diameter of the pick-up ports is important, and is a function of a selected pump, the rate at which fluid is to removed from the enclosure and other factors. In particular, for a given pump, too small a diameter will result in too little fluid being removed from the system. Conversely, a diameter that is too large will result in too large a volume of vapor, and too little liquid, resulting in removal of too little fluid overall. Accordingly, a preferred pick-up port diameter is between these extremes. Referring to the resister network 400, a resistance value 418 associated with each of the pick-up ports 112-126, 402-416 is partly related to whether the pick-up port is covered by liquid or gas, and partly related to the diameter of the pick-up port.

Because fluctuation in the number of pick-up ports covered by liquid is a factor in the fluid metering problem, reducing the variation in the percentage of the pick-up ports that are covered by liquid simplifies finding a solution of the fluid metering problem. The mass flow rate through each path is a function of resistance. The resistance is in turn a function of fluid density. The dependence of resistance on density can be used to manipulate the flow rate of each phase (liquid and gas) through the network. Restrictive orifices can be added to each path to counteract the hydrostatic head and balance the flow.

The mass flow rate through a path associated with any pick-up port is a function of the total pressure drop between the enclosure and the pump inlet. That is: $\dot{m}=f(\Delta P_{total})$. The total pressure drop is composed of the pressure drops of the individual components in the pickup path: $\Delta P_{total}=\Delta P_h+\Delta P_o+\Delta P_{hx}$ Where:

$\Delta P_h$=hydrostatic head $\Delta P_o$=pressure drop across orifice $\Delta P_{hx}$=pressure drop across other system components, primarily heat exchanger Note that in FIGS. 2 and 3, the hydrostatic head is related to the distance ($\overline{dz}$) between the pump inlet 202, 318 and a fluid level 206, 312 within the enclosure. For example, within the enclosure of each system 200, 300, there is a region of liquid 210, 316 and a region of vapor 208, 214. A surface 206, 312 divides the two, and is dependent on the attitude of the system. Thus, the hydrostatic head is the pressure required to overcome the distance between the liquid surface 206, 312 and a parallel line 204, 320 passing through the pump inlet 202, 318.

Thus, hydrostatic head is proportional to the density of the fluid and the distance between the surface (e.g. 206, 312 of FIGS. 2 and 3, respectively) and the pump inlet 202, 318. Thus, hydrostatic head can be modeled as $\Delta P_h=\rho(\overline{g}\cdot\overline{d})$ Where:

$\rho$=fluid density $\overline{g}$=acceleration vector $\overline{d}$=displacement vector from pickup to pump inlet Mass flow rate ($\dot{m}$) through an orifice varies as the square root of the density of the fluid. For example:

$$\dot{m} = C_d A \sqrt{2\Delta P_o \rho} \Rightarrow \Delta P_o = \left(\frac{1}{C_d A}\right)^2 \frac{\dot{m}^2}{2\rho}$$

Where:

$C_d$=orifice coefficient

A=orifice area

Mass flow rates through other restrictions vary as the square root of the density of the fluid. Accordingly:

$$\dot{m} = k\sqrt{2\Delta P_{hx}\rho} \Rightarrow \Delta P_{hx} = \left(\frac{1}{k}\right)^2 \frac{\dot{m}^2}{2\rho}$$

Where:

k=loss coefficient of system

The total pressure drop through a pickup channel is the sum of the individual pressure drops.

$$\Delta P_{total} = \Delta P_h + \Delta P_o + \Delta P_{hx} = \rho(\overline{g} \cdot \overline{d}) + \left(\frac{1}{C_d A}\right)^2 \frac{\dot{m}}{2\rho} + \left(\frac{1}{k}\right)^2 \frac{\dot{m}}{2\rho}$$

Solving for $\dot{m}$ yields:

$$\dot{m} = \sqrt{\frac{2\rho(\Delta P_{total} - \rho\overline{g} \cdot \overline{d})}{\left[\left(\frac{1}{C_d A}\right)^2 + \left(\frac{1}{k}\right)^2\right]}}$$

$C_d A$, k, and z (where z is distance of a pick-up port above or below the pump) are design controllable parameters. The term $\Delta P_{total}$ is the only variable that is controllable during operation. The value of $\Delta P_{total}$ is controlled by pump speed. The pick-up port position ($d_1$) is predetermined by the pick-up port placement, wherein the placement is configured to lower variability in a number of orifices submerged in liquid. Therefore, a design goal is to choose $C_d A$ and k so that the proper mass flow rates of liquid and vapor are achieved within the operating range of $\Delta P_{total}$ of the pump. In a preferred system design, k is much smaller than $C_d A$ and can be ignored. For ports in vapor, the term $\rho\overline{g} \cdot \overline{d}$ is several orders of magnitude less than the $\Delta P_{total}$ or $\rho\overline{g} \cdot \overline{d}$ associated with ports immersed in liquid, and can be ignored for simplification.

For a system (e.g. system 100 or 200 of FIGS. 1 and 2, respectively) with four ports submerged in liquid and twelve ports in vapor, the vapor mass flow rate ($\dot{m}_v$), the liquid mass flow rate ($\dot{m}_l$), and the total mass flow rate ($\dot{m}_{total}$) are given as:

$$\dot{m}_v = \sum_1^{12} \sqrt{\frac{2\rho_v(\Delta P_{total})}{\left(\frac{1}{C_d A}\right)^2}} = 12 C_d A \sqrt{2\rho_v(\Delta P_{total})}$$

$$\dot{m}_l = \sum_1^4 \sqrt{\frac{2\rho_l(\Delta P_{total} - \rho_l \overline{g} \cdot \overline{d}_i)}{\left(\frac{1}{C_d A}\right)^2}} = C_d A \sum_1^4 \sqrt{2\rho_l(\Delta P_{total} - \rho_l \overline{g} \cdot \overline{d}_i)}$$

$$\dot{m}_{total} = \dot{m}_v + \dot{m}_l$$

The relation can be simplified further if the hydrostatic head term ($\rho\overline{g} \cdot \overline{d}$) is considered constant between all pick-up ports submerged in liquid. This is a valid assumption because the free surface of the liquid 206, 312 in the enclosure is at a constant distance from the pump inlet 202, 318 in the direction of $\overline{g}$ as illustrated in FIGS. 2 and 3. With this simplification, the mass flow rates become:

$$\dot{m}_v = 12 C_d A \sqrt{2\rho_v(\Delta P_{total})}$$

$$\dot{m}_l = 4 C_d A \sqrt{2\rho_l(\Delta P_{total} - \rho_l \overline{g} \cdot \overline{d}_i)}$$

$$\dot{m}_{total} = 12 C_d A \sqrt{2\rho_v(\Delta P_{total})} + 4 C_d A \sqrt{2\rho_l(\Delta P_{total} - \rho_l \overline{g} \cdot \overline{d}_i)}$$

The total mass flow rate out of the enclosure through the pick-up ports may approximate the mass flow rate into the enclosure through the atomizers to maintain the system operation. The ratio of $\dot{m}_l$ to $\dot{m}_v$ may approximate the ratio generated in the enclosure. The ratio of liquid to vapor mass flow of the outlet stream may approximate the ratio of the mass flow rate through the pick-up ports submerged in liquid to the mass flow rate through the pick-up ports in vapor. Thus, the ratios can be expressed as:

$$\frac{\dot{m}_l}{\dot{m}_v} = \frac{4 C_d A \sqrt{2\rho_l(\Delta P_{total} - \rho_l \overline{g} \cdot \overline{d}_i)}}{12 C_d A \sqrt{2\rho_v(\Delta P_{total})}}$$

$$\frac{\dot{m}_l}{\dot{m}_v} = \frac{1}{3}\sqrt{\frac{\rho_l(\Delta P_{total} - \rho_l \overline{g} \cdot \overline{d}_i)}{\rho_v(\Delta P_{total})}}$$

Both $\dot{m}_{total}$ and $\dot{m}_l/\dot{m}_v$ are determined by the spray configuration and the heat load, and therefore are known. The term $\dot{m}_{total}$ is preset by the atomizer selection and the discharge pressure. The ratio $\dot{m}_l/\dot{m}_v$ is a function of the system heat load and the heat lost through the walls of the enclosure. Any heat lost through the walls results in condensation in the enclosure and an increase in $\dot{m}_l/\dot{m}_v$.

Implementation

Figure 5:
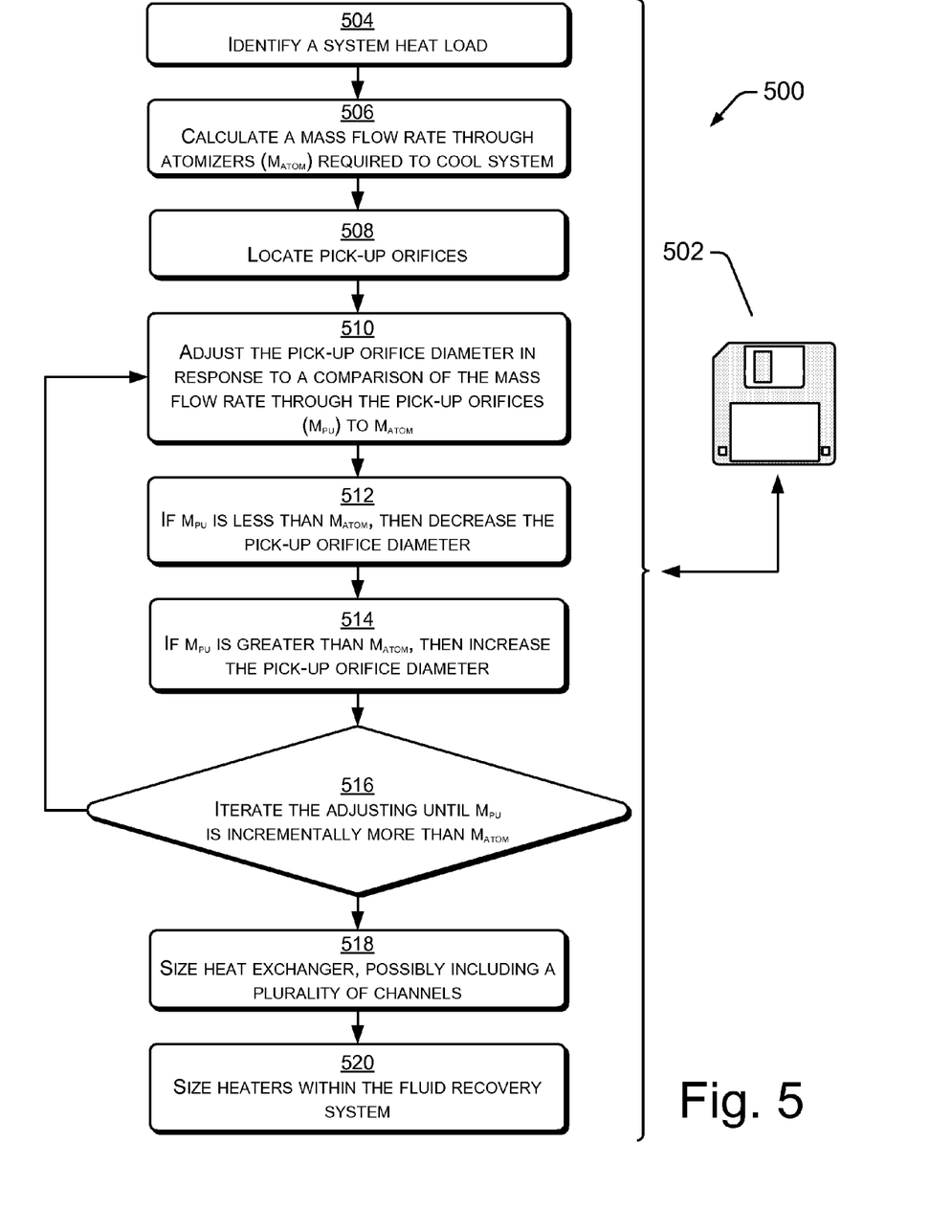
FIG. 5 illustrates an example method by which a passive fluid recovery system can be designed.

FIG. 5 illustrates an example method 500 by which a passive fluid recovery system (e.g. systems 100, 200, 300, 400 of FIGS. 1-4) can be designed. The method 500 can be implemented in software 502, hardware (e.g. such as by use of an application specific integrated circuit (ASIC)) or in firmware or other environment. In one implementation, the method uses the system heat load, spray configuration, saturation temperature, ambient temperature, pickup placement, pickup orifice diameter, and enclosure orientation as inputs. The method can output the total mass flow rate through the pickup system ($\dot{m}_{pu}$). The output can be compared to the fixed mass flow rate through the atomizers ($\dot{m}_{atom}$). If $\dot{m}_{pu}$ is less than $\dot{m}_{atom}$, the pickup orifice diameter size is decreased and the software is rerun. If $\dot{m}_{pu}$ is greater than $\dot{m}_{atom}$, then the pickup orifice size is increased and the software is rerun. This process may be repeated until the proper orifice size is found. It should be noted that the system will still operate if the calculated $\dot{m}_{pu}$ is greater than $\dot{m}_{atom}$ since the true $\dot{m}_{pu}$ is limited to $\dot{m}_{atom}$ by the control of the atomizer discharge. The higher calculated $\dot{m}_{pu}$ indicates that the change in pressure ($\Delta P$) across the pickup orifices is greater than needed to move the required mass flow. Note that an elevated $\Delta P$ may be detrimental, in that it can elevate the saturation temperature in the enclosure. Therefore, the pickup orifice diameter should be as large as possible while maintaining enough $\dot{m}_{pu}$.

Referring again to FIG. 5, the method 500 by which a passive fluid recovery system is designed can be seen in greater detail. At block 504, a system heat load is identified. Referring to FIG. 1, an example of the heat load is the heat produced by the load boards 108. The load boards can be any heat-producing device; however, the load boards are typically one or more electronic assemblies.

At block 506, a fluid flow rate through atomizers ($\dot{m}_{atom}$) associated with the system heat load is calculated. The fluid flow rate can be a function of the system heat load, identified at block 504. In an example implementation, the electrical consumption of the load board 108 is calculated, measured or otherwise determined, thereby revealing the associated heat load. Having established the system heat load, an associated mass flow rate through the atomizers is calculated. The mass flow rate through the atomizers is the amount of fluid that will be required to remove the system heat load. Referring to FIG. 1, the spray module atomizers 106 direct fluid spray (not shown) at the load boards 108, thereby removing heat from the load boards at approximately the rate that heat is produced.

At block 508, pick-up orifices are located within an enclosure to make variation in pick-up orifice liquid coverage substantially attitude independent. The enclosure can be configured as a clamshell, wherein two dimensions of the enclosure are substantially greater than a third dimension. In this case, illustrated in FIGS. 1 and 2, two pick-up orifices (e.g. 112 and 114) may be located near each corner in each of the two larger sides of the enclosure 102. As seen in the above discussion, such a clamshell enclosure generally limits variation in pick-up orifice liquid coverage to 19% to 25%. The enclosure can alternatively be configured with substantially equally sized sides. In that case, illustrated in FIG. 3, a single pick-up port (e.g. port 304) is located in each corner of each side. Such an enclosure generally limits variation in pick-up orifice liquid coverage to 12.5% to 16.7%. While the examples of FIGS. 1-3 are illustrative, other enclosure configurations could be envisioned, and pick-up orifices located within them.

At block 510, the pick-up orifice diameter is adjusted in response to a comparison of the mass flow rate through the pick-up port system ($m_{pu}$) to the flow rate through atomizers ($\dot{m}_{atom}$). In the example of block 512, if $\dot{m}_{pu}$ is less than $\dot{m}_{atom}$, then the adjustment includes decreasing the pick-up orifice diameter. That is, if the diameter of the pick-up orifices is too large, then the volume of fluid removed will consist of too much vapor and not enough liquid, meaning that the mass of fluid removed is too small. Accordingly, the pick-up port orifice diameter should be decreased, thereby preventing the more easily collected vapor from comprising too large a portion of the total fluid volume. Conversely, in the example of block 514, if $\dot{m}_{pu}$ is greater than $\dot{m}_{atom}$, then the pick-up orifice diameter should be increased. That is, if the diameter of the pick-up orifices is too small, then the volume of fluid removed will consist of too much liquid and not enough vapor, meaning that the mass of fluid removed is too large. Accordingly, the pick-up port orifice diameter should be increased.

At block 516, in one implementation, the adjustments of blocks 510-514 may be performed in an iterative manner. The iterations are performed until adjustments made to the orifice size result the ability to remove fluid from the enclosure ($\dot{m}_{pu}$) that is incrementally greater than the fluid required by the atomizers ($\dot{m}_{atom}$) to remove the system heat load.

At block 518, a heat exchanger is sized to result in complete condensation of vapor removed from all pick-up ports. In one implementation, a compound heat exchanger is configured to include as many channels 146 as there are pick-up ports defined within the enclosure. In such a heat exchanger, vapor drawn through non liquid-submerged pick-up ports can be fully condensed within associated channels in the compound heat exchanger. Fluid drawn through liquid-submerged submerged pick-up ports can be sub-cooled within associated channels in the compound heat exchanger. By determining the range in the quantities of liquid and vapor fluid removed from the system, the size of the heat exchanger can be determined. If the heat exchanger includes a separate channel to condense and/or cool fluid removed from each orifice, then 16 channels will be required for the 16 orifices defined in the clamshell enclosure of FIGS. 1 and 2, and 24 channels will be required for the 24 orifices defined in the enclosure of FIG. 3. In either case, channels within a compound heat exchanger should be sized so that vapor drawn through a pick-up port can be fully condensed within an associated channel.

In some implementations, the pick-up orifices can be integrated into the heat exchanger to help distribute the flow through each heat exchanger channel. Additionally, the heat exchanger can include distribution plates consisting of a plate with orifices to distribute flow through the heat exchanger. Since the systems described herein are adapted for restrictive orifices for fluid metering, they can be utilized to distribute flow in the heat exchanger. Thus, an implementation can be configured to replace a pick-up port comprising a single 0.025" orifice with a pick-up port comprising five 0.011" orifices.

At block 520, heaters for inclusion within the fluid recovery system are sized to generate sufficient vapor quality so that $m_{pu}$ incrementally exceeds $m_{atom}$ upon system start-up. In general, the heaters convert liquid fluid into vapor fluid, and thereby increase the vapor quality. This increases the mass of fluid removed by pick-up orifices covered by vapor, and therefore increases the mass of fluid $m_{pu}$ removed by the combined number of pick-up ports. With sufficient heating at start-up, the mass of the fluid removed from the pick-up ports $m_{pu}$ will be capable of matching the mass of fluid $m_{atom}$ required for the atomizers.

In one example of operation of software 502 implementing the method 500, the optimum pick-up orifice diameter was found to be 0.025". In other systems, the orifice diameter is between 0.01" and 0.05". The 0.025" orifice diameter allows the system to operate from approximately 160 W to 280 W. Below 150 W the vapor quality drops below 0.2 and the system cannot remove enough liquid from the enclosure. Above 280 watts, temperatures within the enclosure rise above 75 C. It should be noted that vapor quality is a dominate factor in determining if the system will operate. The vapor quality threshold for operation is a function of the hydrostatic head of the pickups. For some systems, the threshold is around 0.23. Below this value, these systems may not operate.

In a further example of a passive fluid recovery system (e.g. systems 100, 200, 300, 400 of FIGS. 1-4), the orifice size used in each of the pick-up ports should result in a balanced withdrawal fluid. That is, the fluid withdrawn from the enclosure should be balanced between the gas and liquid phases. Such balance results when fluid is removed from both submerged and non-submerged pick-up ports having an orifice diameter within an acceptable range. In particular, the orifice diameter should be adjusted so that the fluid withdrawn is balanced between liquid and gas, and so that the combined fluid mass removed results in a value of $m_{pu}$ that is approximately equal to, or potentially incrementally greater than, $m_{atom}$ in a system that is substantially attitude independent.

Heat Exchanger

In one implementation, a counter flow heat exchanger could be configured with lanced and offset folded fin stock on the 'air side' of the heat exchanger, and mini-channels on the 'cooling fluid side' of the heat exchanger. Use of folded fin stock with a tight pitch takes advantage of the available 1.0 pound in $H_2O$ pressure drop on the 'air side.' This provides a large surface area enhancement on the 'air side' and a satisfactory heat transfer coefficient. The implementation can include mini-channels on the liquid side. The mini-channels provide high heat transfer coefficients and a high surface area to fluid volume-transferred ratio. Also, they prevent vapor bypass that is common in parallel path condensers. Vapor bypass results when vapor moves rapidly through the heat exchanger by bypassing fluid in the same channel. Use of mini-channels of a cross-sectional diameter appropriate to the fluid used, prevents vapor bypass and requires the fluid to spend the requisite time in the heat exchanger to condense fully. While lanced and offset or folded fin stock used on the 'wet side' and wavy fins on the 'air side' can be used to provide adequate heat transfer, other heat exchanger technologies and/or surface enhancements could alternatively or additionally be used. For example, technologies commonly known in the art of heat exchangers and heat sinks, including pin fins, diamond paints or foams, mini or micro-channels, etc., can be used to transfer heat.

Referring again to FIG. 1, it can be seen that the vapor exiting the enclosure 102 is condensed within the heat exchanger 132 prior to entering the pump 142. If vapor is allowed to enter the pump, a loss of pump suction will result, possibly interrupting the spray (i.e. spray discharge from the atomizer module 106). Any pick-up port 112-126 can remove saturated vapor, saturated liquid, or any combination of the two from the enclosure 102. Therefore, in a preferred embodiment, each pick-up port directs the removed fluid through a path within the heat exchanger 132 that is capable of fully condensing a stream of 100% vapor.

Example Operation of a Passive Fluid Recovery System

Figure 6:
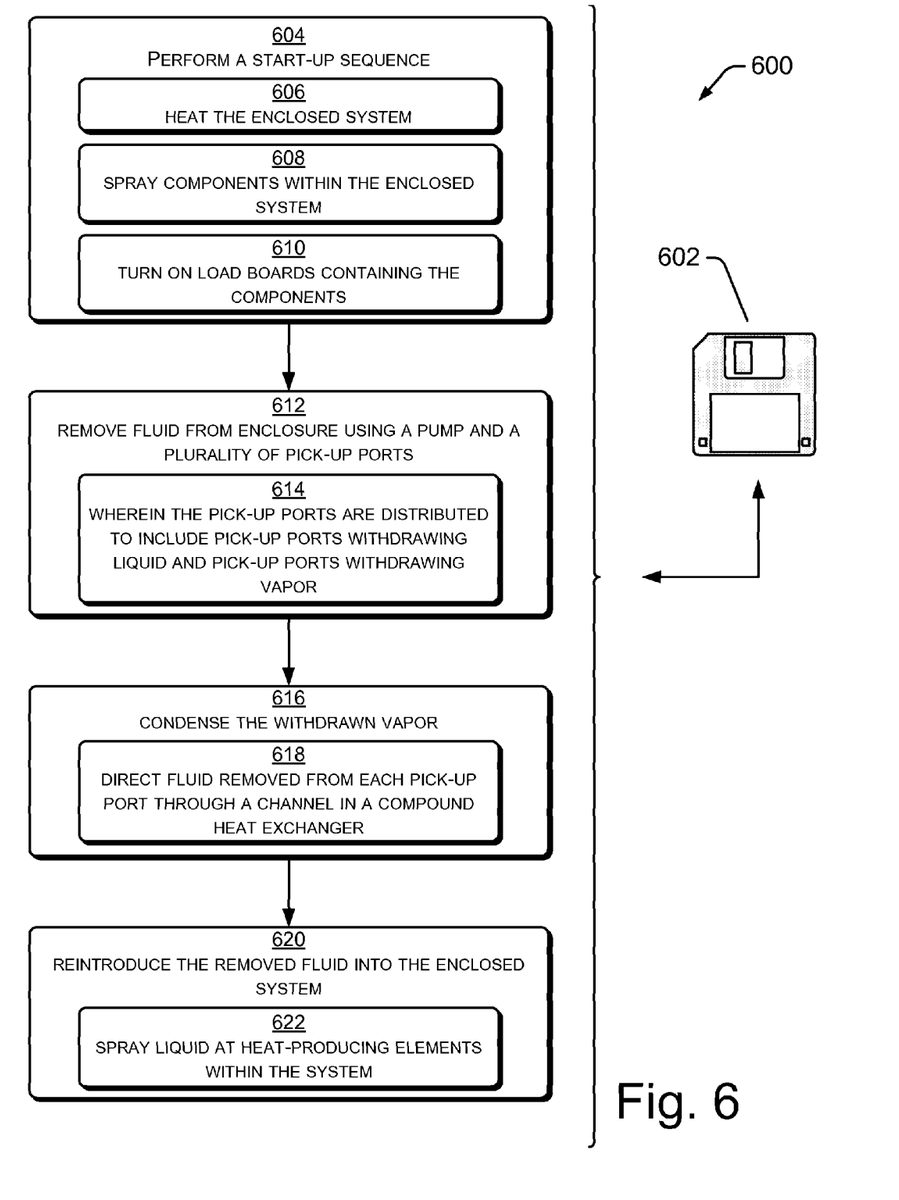
FIG. 6 illustrates an example method by which a passive fluid recovery system can be operated.

FIG. 6 illustrates an example method 600 by which a passive fluid recovery system (e.g. systems 100, 200, 300, 400 of FIGS. 1-4) can be operated. The method can be implemented by operation of a digital control system, which may be configured to execute instructions based on software 602, firmware or hardware (such as an application specific integrated circuit (ASIC)).

At block 604, a start-up sequence is performed. Blocks 606-610 are representative of a start-up sequence; however, the start-up sequence can be changed to reflect requirements of any particular passive fluid recovery system. At block 606, the enclosed system is heated. Referring briefly to FIG. 1, the heater 110 is configured to heat fluid contained within the enclosure 102, thereby reducing the quantity of liquid and increasing the quantity of vapor (gas). In some implementations, there are two primary reasons for this preheating. First, if the vapor quality (i.e. percentage of the fluid in the vapor phase) is too low, then pick-up orifices exposed to vapor will remove too little fluid mass, and the overall mass of fluid removed by all pick-up orifices will be insufficient to provide the spray module 106 with a fluid level required to cool the load boards 108. A second function for the heaters 110 is to preheat the electronics (or other load 108) during cold starts in extreme environments. Accordingly, at different times during operation, the fluid heats, and also cools, the load board(s) 108. At block 608, the pump is turned on, and components in the enclosed system are sprayed. Referring to the example of FIG. 1, liquid leaving the pump 142 passes through the spray module 106 and cools the load board 108. As seen above, in some applications the spray will initially tend to warm electronic components to more nearly their operating temperature. At block 610, the load boards are turned on, and the heaters (e.g. heaters 110 in FIG. 1) are turned off.

At block 612, fluid is removed from the enclosure using a pump 142 and a plurality of pick-up ports 112-126 (see example of FIG. 1). Block 614 shows one way that block 612 could be performed. At block 614, the pick-up ports are distributed within the enclosure 102 to include pick-up ports withdrawing liquid and pick-up ports withdrawing vapor. In one possible implementation, as the fluid reaches a temperature set point (due to heating by the heater 110), the system pump is ramped up to an operational speed, wherein the pressure of fluid discharged from the pump reaches a steady state. Because the temperature has reached a set point, the vapor quality will have reached a level wherein pick-up ports (including pick-up ports submerged in liquid and in vapor) will remove an expected and sufficient mass of vapor from the system.

At block 616, the withdrawn fluid (a mixture of liquid and vapor) is condensed and/or cooled. For example, the fluid removed from the enclosure 102 of FIG. 1 is condensed in heat exchanger 132. In the example of block 618, fluid removed from each pick-up port can be directed through a channel in a compound heat exchanger. In a typical implementation of a compound heat exchanger, some channels would include vapor that is condensed, and other channels would sub-cool liquid.

At block 620, the fluid removed from the enclosure for condensing and/or sub-cooling is reintroduced to the enclosure. In the example of block 622, liquid is typically reintroduced by spraying the liquid at electronic components to be cooled.

CONCLUSION

Although aspects of this disclosure include language specifically describing structural and/or methodological features of preferred embodiments, it is to be understood that the appended claims are not limited to the specific features or acts described. Rather, the specific features and acts are disclosed only as exemplary implementations, and are representative of more general concepts.

The invention claimed is:

1. A cooling system, comprising:
   an enclosure within which heat, generated by electronics, is cooled by fluid;
   a plurality of pick-up ports defined within the enclosure, wherein:
      the pick-up ports are located to minimize variance in a number of pick-up ports submerged in a liquid component of the fluid as attitude of the cooling system is varied; and
      liquid and vaporous components of the fluid are withdrawn from respective pick-up ports;
   a heat exchanger to convert vaporous fluid removed from the enclosure into liquid fluid; and
   a pump to move fluid between the heat exchanger and the enclosure, wherein, for a given capacity of the pump, an orifice size used in each of the pick-up ports is smaller in cross-sectional area than an orifice that results in removal of mostly vaporous fluid and very little liquid fluid.

2. The cooling system of claim 1, wherein:
   the orifice size is uniformly defined among the plurality of pick-up ports; and
   a combined liquid and vaporous fluid mass removed is substantially attitude independent.

3. The cooling system of claim 1, wherein at least one wall of the enclosure is non-planar or slanted with respect to other walls.

4. The cooling system of claim 1, wherein:
   the enclosure is configured as a clamshell; and
   a pair of pick-up ports are located proximate to each corner of the clamshell.

5. The cooling system of claim 1, additionally comprising:
   a spray module, configured to atomize fluid received from the pump and to re-introduce it to the enclosure.

6. The cooling system of claim 5, additionally comprising:
   a wick, in a fluid path between one or more pick-up ports and the spray module, to prevent circulation of foreign material.

7. The cooling system of claim 1, wherein the heat exchanger comprises:
a compound structure, wherein each pick-up port is associated with one or more heat exchanger channels.

8. The cooling system of claim 1, additionally comprising:
a heater, to increase a percentage of the fluid within the enclosure that is in a vaporous state at start-up.

9. A method of designing a passive fluid recovery system, comprising:
identifying a system heat load within an enclosure;
calculating a system flow rate of fluid required to remove the system heat load from within the enclosure;
locating pick-up ports within the enclosure to make variation in pick-up port liquid coverage substantially attitude independent; and
sizing pump capacity and an orifice size used in each of the pick-up ports to be smaller in cross-sectional area than an orifice that results in removal of mostly vaporous fluid and very little liquid fluid.

10. The method of claim 9, additionally comprising:
adjusting the orifice size of the pick-up ports, wherein the adjusting is in response to a comparison of total mass flow through pick-up ports ($m_{pu}$) with a flow rate through atomizers ($m_{atom}$).

11. The method of claim 10, wherein adjusting the orifice size comprises:
if the $m_{pu}$ is less than the $m_{atom}$, then decreasing the orifice size of the pick-up port.

12. The method of claim 10, wherein adjusting the orifice size comprises:
if the $m_{pu}$ is greater than the $m_{atom}$, then increasing the orifice size of the pick-up port.

13. The method of claim 10, additionally comprising:
iterating the adjusting until the $m_{atom}$ is incrementally less than the $m_{pu}$.

14. The method of claim 10, additionally comprising:
sizing heaters for inclusion within the fluid recovery system to generate sufficient vapor quality so that the $m_{pu}$ incrementally exceeds the $m_{atom}$ upon system start-up.

15. The method of claim 9, additionally comprising:
configuring channels within a compound heat exchanger so that vapor drawn through a pick-up port can be fully condensed within an associated channel.

16. A method of removing heat from an enclosure, comprising:
removing fluid from the enclosure through a plurality of pick-up ports, wherein:
the pick-up ports are distributed so that at least one pick-up port is withdrawing liquid fluid and at least one pick-up port is withdrawing vapor fluid at any attitude of the enclosure; and
the pick-up ports have a cross-sectional area sized to result in withdrawal of both liquid and vapor fluid having overall mass flow rate great enough to remove a system heat load of the enclosure;
condensing the withdrawn vapor; and
spraying heat-generating components within the enclosure with removed fluid, wherein the spraying is performed under pressure created by a pump.

17. The method of claim 16, wherein removing fluid from the plurality of pick-up ports comprises:
removing fluid through two or three orifices located, generally, in each corner of the enclosure.

18. The method of claim 16, wherein the removing is substantially independent of an attitude of the enclosure.

19. The method of claim 16, wherein condensing the withdrawn vapor comprises:
directing fluid removed from each pick-up port through a channel in a compound heat exchanger.

20. The method of claim 16, additionally comprising a start-up sequence comprising:
heating fluid in the enclosure;
spraying components within the enclosure; and
turning on circuit boards containing the components.

21. A fluid recovery system, comprising:
means for removing fluid from an enclosure via a plurality of ports, wherein:
the ports are located to minimize variance in numbers of ports submerged in a liquid fluid component and numbers of ports in communication with a vapor fluid component as attitude of the fluid recovery system is varied;
liquid and vaporous components of the fluid are simultaneously withdrawn from submerged and non-submerged ports, respectively; and
an orifice size used in each of the ports is smaller in cross-sectional area than an orifice that would result in removal of mostly vaporous fluid and very little liquid fluid;
means for condensing and cooling the removed fluid; and
means for reintroducing the condensed and cooled fluid into the enclosure.

22. The fluid recovery system of claim 21, wherein the means for removing fluid from the enclosure comprises:
at least two uniformly sized orifices defined in at least one corner of the enclosure.

23. The fluid recovery system of claim 21, wherein the means for condensing and cooling the removed fluid comprises:
a compound heat exchanger comprising a plurality of channels, each channel in communication with one of the plurality of ports.

24. The fluid recovery system of claim 21, wherein the means for reintroducing the removed fluid into the enclosed system comprises:
a spray module of atomizers.

25. The fluid recovery system of claim 21, additionally comprising:
means for creating vapor pressure within the enclosure prior to turning on load boards cooled by the fluid recover system.

* * * * *